United States Patent
Ishizaka et al.

(10) Patent No.: US 7,989,353 B2
(45) Date of Patent: Aug. 2, 2011

(54) METHOD FOR IN-SITU REFURBISHING A CERAMIC SUBSTRATE HOLDER

(75) Inventors: Tadahiro Ishizaka, Watervliet, NY (US); Kentaro Asakura, Kai (JP); Masanao Ando, Rensselaer, NY (US); Toshio Hasegawa, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 836 days.

(21) Appl. No.: 11/968,369

(22) Filed: Jan. 2, 2008

(65) Prior Publication Data

US 2009/0166327 A1 Jul. 2, 2009

(51) Int. Cl.
*H01L 21/302* (2006.01)
(52) U.S. Cl. ............... 438/724; 438/714; 134/1.2
(58) Field of Classification Search ............ 438/656, 438/706, 710, 712, 714, 724; 134/1.1, 1.2; 216/67
See application file for complete search history.

(56) References Cited

U.S. PATENT DOCUMENTS

| | | | |
|---|---|---|---|
| 6,573,181 B1 * | 6/2003 | Srinivas et al. | 438/656 |
| 7,045,014 B2 | 5/2006 | Mahon | |
| 2001/0040091 A1 * | 11/2001 | Khurana et al. | 204/298.34 |
| 2002/0006724 A1 * | 1/2002 | Shiota et al. | 438/680 |
| 2006/0219178 A1 | 10/2006 | Asakura | |
| 2007/0163617 A1 | 7/2007 | Ozaki | |

* cited by examiner

*Primary Examiner* — Lan Vinh

(57) ABSTRACT

Method for operating a processing system and refurbishing a ceramic substrate holder within a process chamber of the processing system are described. The method includes plasma processing one or more substrates on the ceramic substrate holder, where the processing causes erosion of a nitride material of the ceramic substrate holder. The method further includes refurbishing the ceramic substrate holder in-situ without a substrate residing on the ceramic substrate holder, where the refurbishing includes exposing the ceramic substrate holder to a plasma-excited nitrogen-containing gas in the process chamber to at least partially reverse the erosion of the nitride material.

19 Claims, 4 Drawing Sheets

METHOD FOR IN-SITU REFURBISHING A CERAMIC SUBSTRATE HOLDER

FIELD OF THE INVENTION

The present invention relates to processing systems for processing substrates, and more particularly, to processing systems containing a ceramic substrate holder configured for supporting and heating a substrate during a plasma process performed on the substrates in the processing systems.

BACKGROUND OF THE INVENTION

Many semiconductor manufacturing processes are performed in processing systems such as plasma etch systems, plasma deposition systems, thermal processing systems, chemical vapor processing systems, atomic layer processing systems, etc. A processing system can include a ceramic substrate heater that supports and provides heating of a substrate (e.g., a wafer) during a process performed on the substrate in the processing system. The use of ceramic substrate heater materials can provide several advantages for semiconductor manufacturing, including low thermal expansion, high temperature tolerance, a low dielectric constant, high thermal emissivity, a chemically "clean" surface, rigidity, and dimensional stability that makes them preferred heater materials for many semiconductor applications. Common ceramic materials for use in ceramic substrate heaters include alumina ($Al_2O_3$), aluminum nitride (AlN), silicon carbide (SiC), beryllium oxide (BeO), and lanthanum boride ($LaB_6$).

Repetitive processing of substrates in a processing system can modify a surface of a ceramic substrate holder and other system components in the processing system that are exposed to the process environment. For example, the modification can include formation of material deposits on the ceramic substrate holder or erosion of the ceramic substrate holder material. Since the ceramic substrate holder, and other system components, are designed and manufactured according to strict specifications, the erosion can require frequent ex-situ refurbishing or even replacement of the system components, often at a great cost and long downtimes for the processing system. Therefore, there is a general need for methods for in-situ refurbishing of system components.

SUMMARY OF THE INVENTION

Methods for operating a processing system and refurbishing a ceramic substrate holder in-situ are described. Embodiments of the invention reduce or prevent the need for frequent ex-situ refurbishing or replacement of the ceramic substrate holder, thereby reducing cost and downtime of operating the processing system.

According to one embodiment of the invention, a method is provided for operating a processing system. The method includes processing one or more substrates on a ceramic substrate holder in a process chamber of the processing system by exposing the one or more substrates to a plasma-excited process gas, where the exposing causes erosion of a nitride material of the ceramic substrate holder. The method further includes refurbishing the ceramic substrate holder in-situ without a substrate residing on the ceramic substrate holder, where the refurbishing includes exposing the ceramic substrate holder to a plasma-excited nitrogen-containing gas in the process chamber to at least partially reverse the erosion of the nitride material.

DETAILED DESCRIPTION OF SEVERAL EMBODIMENTS OF THE INVENTION

Methods for operating a processing system and in-situ refurbishing of a ceramic substrate holder are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Figure 1A:
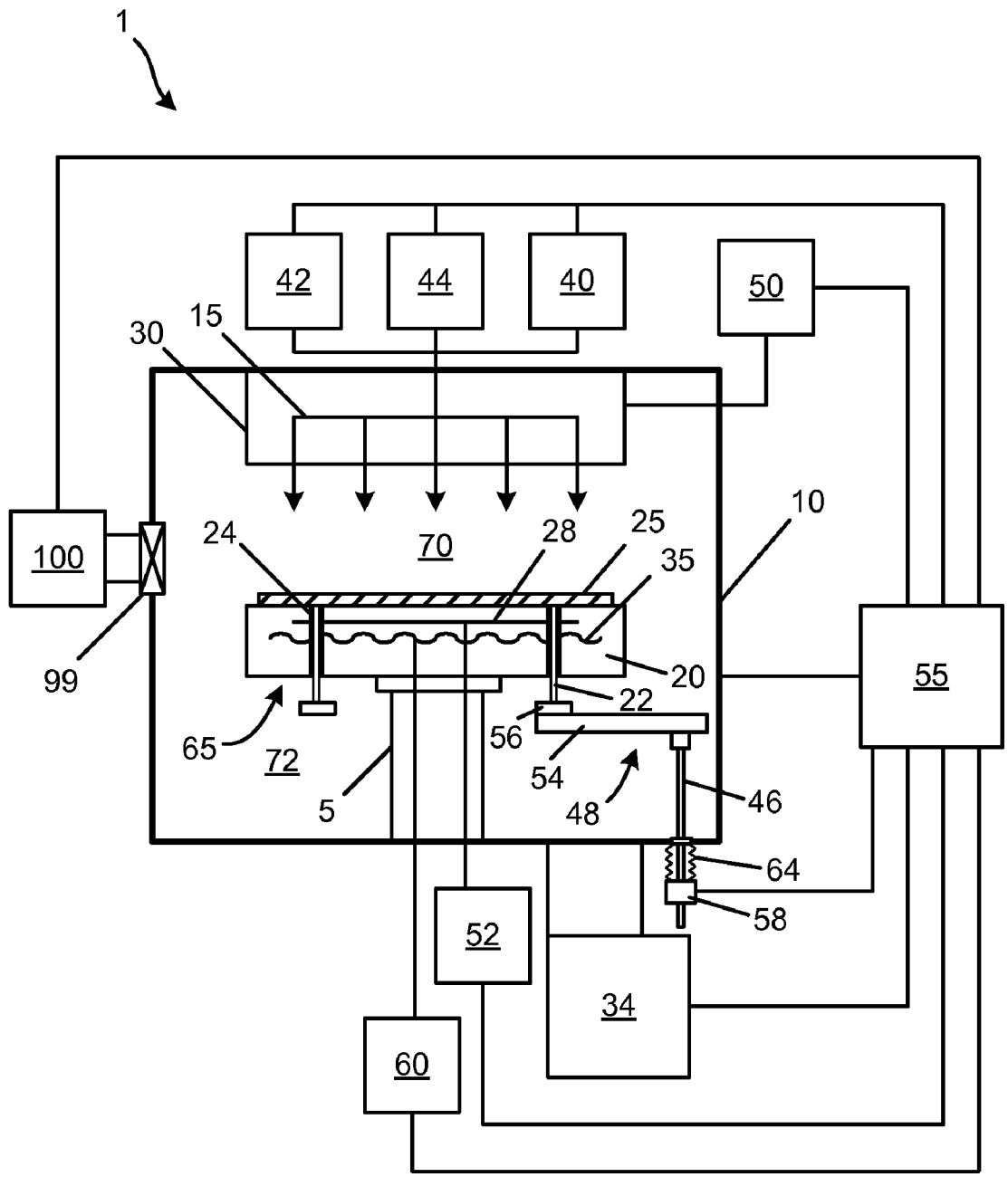
FIG. 1A shows a schematic diagram of a processing system in accordance with an embodiment of the invention.

Referring now to the drawings, FIG. 1A depicts a processing system 1 configured for plasma processing a substrate 25. In one example, the plasma processing can include depositing a thin film or a layer on the substrate 25. In another example, the plasma processing can include etching a feature in the substrate 25 or in a film or layer on the substrate 25. However, the plasma processing is not limited to film deposition and etching and may include other types of plasma processing, such as film conditioning. For example, during metallization of inter-connect and intra-connect structures for semiconductor devices in back-end-of-line (BEOL) operations, a thin conformal barrier layer may be deposited on wiring trenches or vias to minimize or eliminate the migration of metal (e.g., Cu) into the inter-level or intra-level dielectric. Further, a thin conformal seed layer may be deposited on wiring trenches or vias to provide a film with acceptable adhesion properties for bulk metal fill, or a thin conformal adhesion layer may be deposited on wiring trenches or vias to provide a film with acceptable adhesion properties for metal seed deposition. In front-end-of line (FEOL) operations, the processing system 1 may be used to deposit an ultra thin gate dielectric film such as $SiO_2$, and/or a high dielectric constant (high-k) film.

The processing system 1 contains a process chamber 10 having a ceramic substrate holder 20 configured to support the substrate 25 to be processed. The ceramic substrate holder 20 is mounted on a pedestal 5 on a lower surface 65 of the ceramic substrate holder 20. The processing system 1 may be configured to process 200 mm wafers, 300 mm wafers, or larger-sized substrates on the ceramic substrate holder 20. In fact, it is contemplated that the processing system 1 may be configured to process substrates, wafers, or LCDs regardless of their size, as would be appreciated by those skilled in the art. Therefore, while aspects of the invention will be described in connection with the processing of a semiconductor substrate, the invention is not limited solely thereto. One example of a ceramic substrate holder 20 is an AlN substrate holder for processing 300 mm wafers, manufactured by Sumitomo Electric Limited, Tokyo, Japan.

The substrate 25 is transferred into and out of the process chamber 10 through a chamber feed-through 99 via a robotic substrate transfer system 100. When transferred into the process chamber 10, the substrate 25 is received by a lift mechanism 48 containing substrate lift pins 22 housed in holes 24 within the ceramic substrate holder 20. The processing system 1 contains three lift pins 22 (only two are shown in FIG. 1A). The lift pins 22 are made of quartz or a ceramic material such as $Al_2O_3$, $SiO_2$, or AlN. Once the substrate 25 is received from the robotic substrate transfer system 100, it is lowered to an upper surface of the ceramic substrate holder 20. The lower end portion of each lift pin 22 rests against a support plate 56 attached to an arm 54. The arm 54 is connected to a rod 46 of an actuator 58 positioned below the process chamber 10. The rod 46 extends through bellows 64 positioned the bottom on the process chamber 10.

The process chamber 10 contains an upper assembly 30 coupled to a first process material supply system 40, a second process material supply system 42, and a purge gas supply system 44. The upper assembly 30 can contain a showerhead having a large number of gas delivery holes formed in a lower surface of the showerhead and facing the substrate 25 for delivering gases 15 into a processing space 70 above the substrate 25. The first process material supply system 40 and the second process material supply system 42 can be configured to alternately introduce first and second process materials to the process chamber 10. The alternation of the introduction of the first and second process materials can be cyclical, or it may be acyclical with variable time periods between introduction of the first and second process materials. The first process material can, for example, comprise a film precursor with a composition having the principal atomic or molecular species found in the film formed on the substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

The purge gas supply system 44 is configured to introduce a purge gas to process chamber 10. For example, the introduction of purge gas may occur between introduction of the first and second process materials to the process chamber 10, or following the introduction of the second process material to process chamber 10. The purge gas can contain an inert gas, such as a noble gas (i.e., helium, neon, argon, xenon, krypton), or nitrogen ($N_2$), or hydrogen ($H_2$).

The processing system 1 contains a plasma generation system configured to generate a plasma in the processing space 70 during at least a portion of the alternating introduction of the first process material and the second process material to process chamber 10. The plasma generation system includes a first power source 50 coupled to the process chamber 10 and configured to couple power to the first process material, or the second process material, or both, in the processing space 70 by energizing the upper assembly 30. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the ceramic substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art. A typical frequency for the application of RF power to the electrode formed in the upper assembly 30 can, for example, range from 10 MHz to 200 MHz and can be 60 MHz, and the RF power applied can, for example, be between about 500 Watts (W) and about 2200 W.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

The processing system 1 contains a substrate bias system configured to optionally generate or assist in generating a plasma during at least a portion of the alternating introduction of the first process material and the second process material to process chamber 10. The substrate bias system includes a substrate power source 52 coupled to the process chamber 10, and configured to couple power to the ceramic substrate holder 20. The substrate power source 52 contains a radio frequency (RF) generator and an impedance match network. The substrate power source 52 is configured to couple power to the first process material, or the second process material, or both, in the processing space 70 by energizing an electrode 28 in the ceramic substrate holder 20 and the substrate 25. A typical frequency for the RF bias can range from about 0.1 MHz to about 100 MHz, and can be 13.56 MHz. RF bias systems for plasma processing are well known to those skilled in the art. Alternately, RF power is applied to the electrode 38 at multiple frequencies.

The processing system 1 contains a substrate temperature control system 60 coupled to the ceramic substrate holder 20 and configured to elevate, lower, and control the temperature of substrate 25. The substrate temperature control system 60 is coupled to a resistive heating element 35 in the ceramic substrate holder 20. The substrate temperature control system 60 can further contain temperature control elements, such as a cooling system including a re-circulating coolant flow that receives heat from the ceramic substrate holder 20 and transfers heat to a heat exchanger system (not shown). Additionally, the temperature control elements can include heating/cooling elements which can be included in the ceramic substrate holder 20, as well as the chamber wall of the process chamber 10 and any other component within the processing system 1.

In order to improve the thermal transfer between the substrate 25 and the ceramic substrate holder 20, the ceramic substrate holder 20 can include a mechanical clamping system, or an electrical clamping system, such as an electrostatic clamping system, to affix the substrate 25 to an upper surface of ceramic substrate holder 20. Furthermore, the ceramic substrate holder 20 can further include a substrate backside gas delivery system configured to introduce gas to the backside of substrate 25 in order to improve the gas-gap thermal conductance between the substrate 25 and the ceramic substrate holder 20. Such a system can be utilized when good temperature control of the substrate 25 is required at elevated or reduced temperatures. For example, the substrate backside gas system can comprise a two-zone gas distribution system, wherein the helium gas gap pressure can be independently varied between the center and the edge of the substrate 25.

Furthermore, the process chamber 10 is coupled to a pressure control system 34 that includes a vacuum pumping system and a variable gate valve for controllably evacuating the process chamber 10 to a pressure suitable for processing the substrate 25, and suitable for use of the first and second process materials. The vacuum pumping system can include a turbo-molecular vacuum pump (TMP) or a cryogenic pump capable of a pumping speed up to about 5000 liters per second (and greater). In conventional plasma processing devices utilized for thin film deposition or dry etching, a 300 to 5000 liter per second TMP is generally employed. Moreover, a device for monitoring chamber pressure, for example a capacitance manometer (not shown) can be coupled to the process chamber 10.

The processing system 1 contains a controller 55 that is coupled to the process chamber 10, pressure control system 34, first process material supply system 40, second process material supply system 42, purge gas supply system 44, first power source 50, substrate power source 52, actuator 58, substrate temperature control system 60, and robotic substrate transfer system 100. In addition, the controller 55 can be coupled to one or more additional controllers/computers (not shown), and the controller 55 can obtain setup and/or configuration information from an additional controller/computer. The controller 55 can be used to configure, collect, provide, process, store, and display data from the processing system 1. The controller 55 can comprise a number of applications for controlling the processing system 1. For example, controller 55 can include a graphic user interface (GUI) component (not shown) that can provide easy to use interfaces that enable a user to monitor and/or control the processing system 1.

The controller 55 can comprise a microprocessor, memory, and a digital I/O port capable of generating control voltages sufficient to communicate and activate inputs to the processing system 1 as well as monitor outputs from the processing system 1. For example, a program stored in the memory may be utilized to activate the inputs of the processing system 1 according to a process recipe in order to perform a film deposition process. The controller 55 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 55 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 55, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 55 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 55.

The controller 55 may be locally located relative to the processing system 1, or it may be remotely located relative to the processing system 1. For example, the controller 55 may exchange data with the processing system 1 using at least one of a direct connection, an intranet, the Internet and a wireless connection. The controller 55 may be coupled to an intranet at, for example, a customer site (i.e., a device maker, etc.), or it may be coupled to an intranet at, for example, a vendor site (i.e., an equipment manufacturer). Additionally, for example, the controller 55 may be coupled to the Internet. Furthermore, another computer (i.e., controller, server, etc.) may access, for example, the controller 55 to exchange data via at least one of a direct connection, an intranet, and the Internet. As also would be appreciated by those skilled in the art, the controller 55 may exchange data with the processing system 1 via a wireless connection.

As described above, the plasma generation system is configured to generate plasma in the processing space 70 through application of RF power by first power source 50 to upper assembly 30, through application of RF power by substrate power source 52 to electrode 28 the ceramic substrate holder 20, or both. However, in addition to generation of plasma in the processing space 70, plasma is also generated in the exhaust space 72 below the ceramic substrate holder 20. The plasma generated in processing space 70 and in exhaust space 72 interact with the substrate 25 and with surfaces of system components in the process chamber 10, including exposed surfaces of the upper assembly 30, the ceramic substrate holder 20, the pedestal 5, the walls of the process chamber 10, etc. As used herein, system components refer to components of the processing system 1 that are located within the process chamber 10, but excludes the substrate 25.

Prolonged plasma exposures can seriously erode exposed surfaces of one or more system components in the process chamber 10. In general, the erosion includes removal of material from a surface of a system component. The erosion can include preferential removal of one or more types of elements from the system components, for example preferential nitrogen removal from a nitride material such as aluminum nitride. The erosion can also include modification of the chemical composition of the system components, for example incorporation of additional elements (e.g., oxygen) from the plasma-excited process gas. Since the system components are designed and manufactured according to strict specifications, this erosion can affect processing conditions in the process chamber 10, including plasma density, precursor concentration, gas flow, particle generation, and/or metal contamination; thereby requiring frequent ex-situ refurbishing or even replacement of the affected system components. This often results in great cost and long downtimes for the processing system 1. Therefore, there is a general need for methods for in-situ refurbishing of system components.

Figure 1B:
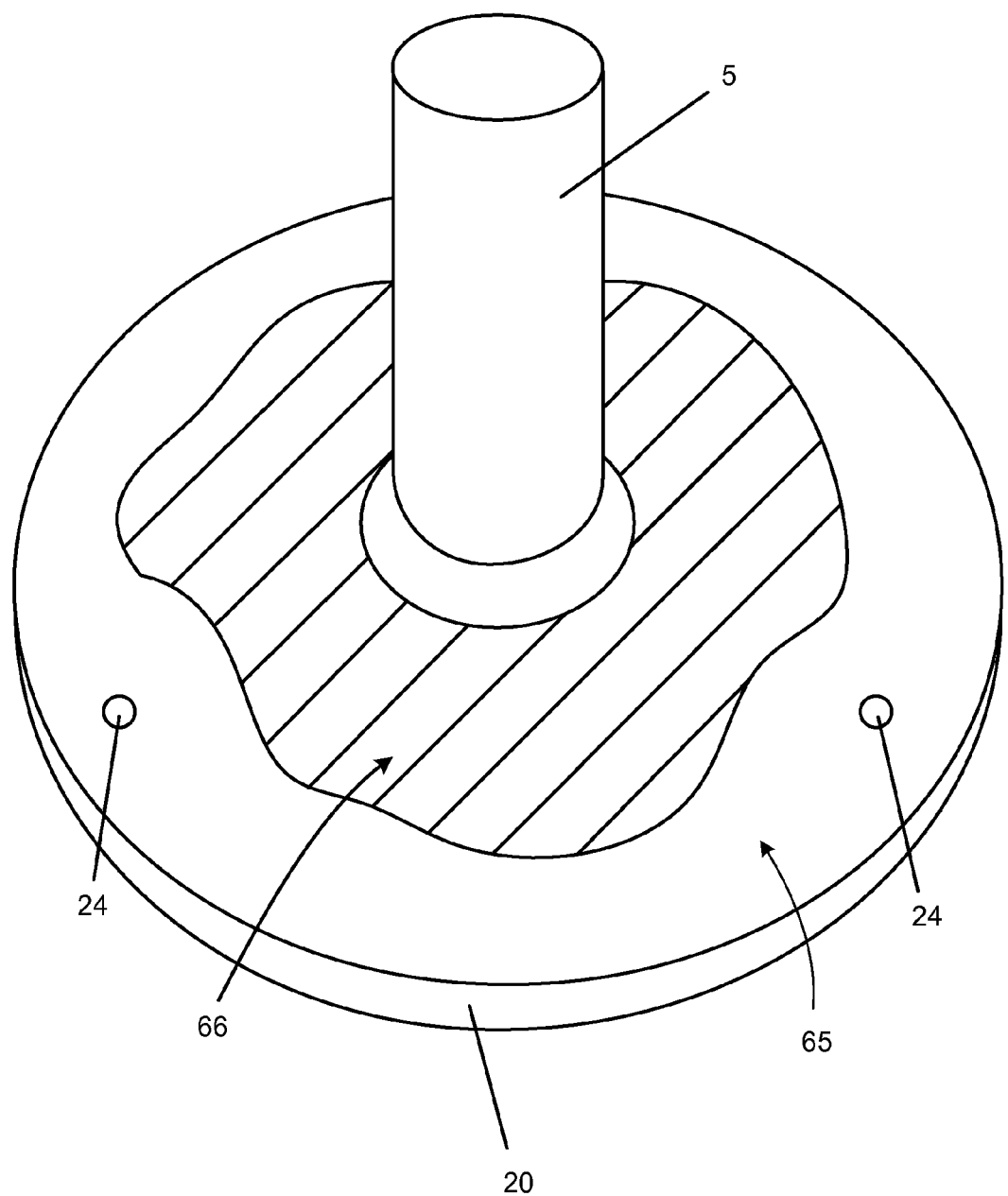
FIG. 1B shows a schematic bottom view of the ceramic substrate holder from the processing system depicted in FIG. 1A after prolonged exposures to a hydrogen-containing plasma.

According to embodiments of the invention, the ceramic substrate holder 20 contains a nitride material. The nitride material can include aluminum nitride, silicon nitride, boron nitride, or other nitrides. In one example, following prolonged plasma exposures in the process chamber 10, erosion of aluminum nitride material of the ceramic substrate holder 20 was visually observed during inspection. FIG. 1B shows a schematic bottom view of the ceramic substrate holder 20 of the processing system 1 depicted in FIG. 1A after interrupted exposures to a hydrogen-containing plasma for a total plasma exposure of about 5 hours. The plasma exposures formed a shiny region 66 on a large portion of the lower surface 65 of the otherwise greyish matte finish of ceramic substrate holder 20. The current inventors believe that the clearly visible shiny region 66 is due to metallic aluminum formed by preferential nitrogen removal from the aluminum nitride material during interaction of the aluminum nitride material with hydrogen radicals in the plasma. Embodiments of the invention provide a method for in-situ refurbishing of the aluminum nitride material of the ceramic substrate holder 20.

Figure 2:
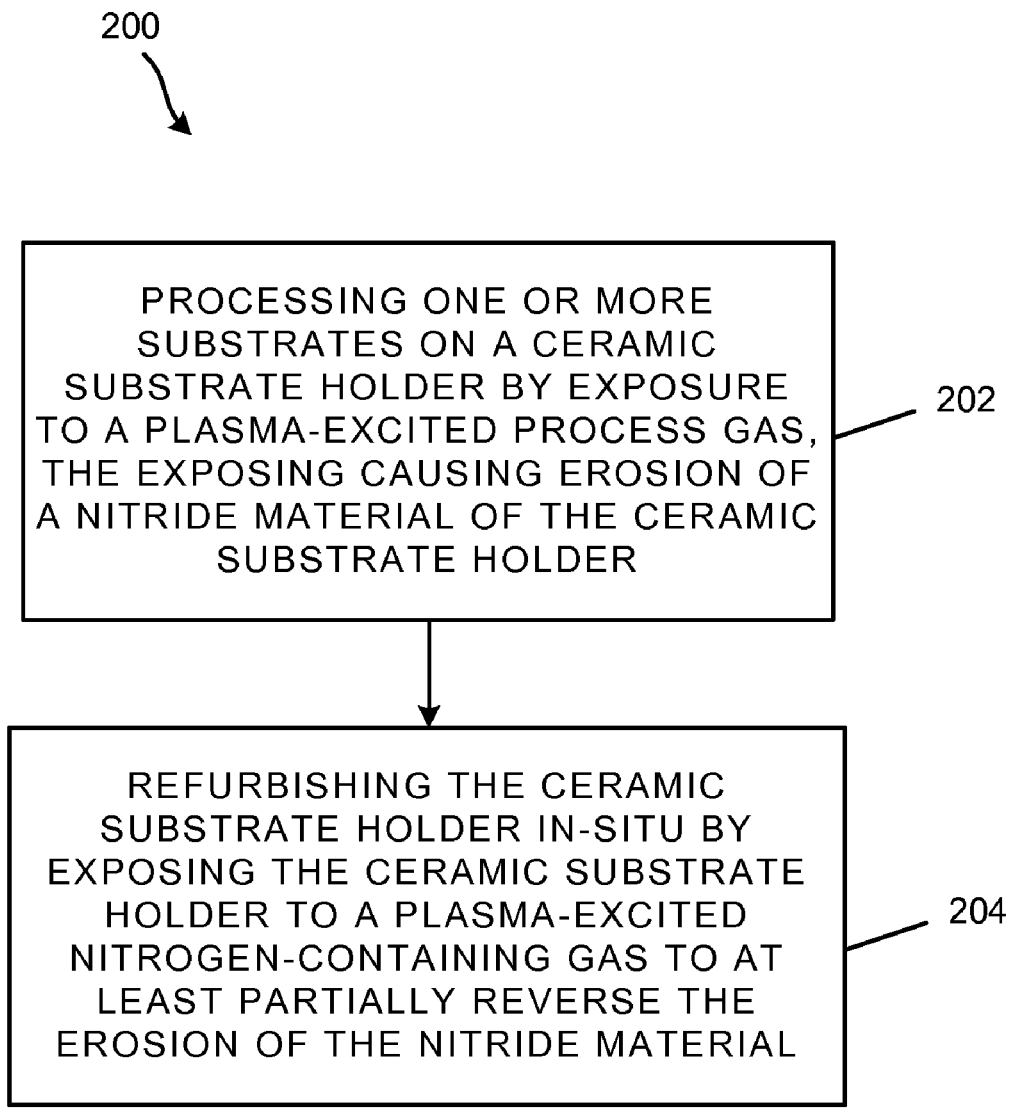
FIG. 2 is a flowchart of a method for operating a processing system containing of a ceramic substrate holder according to an embodiment of the invention.

FIG. 2 is a flowchart of a method for operating a processing system containing of a ceramic substrate holder according to an embodiment of the invention. The process flow 200 includes, in block 202, processing one or more substrates on a ceramic substrate holder in a process chamber of a processing system. The processing of the one or more substrates includes exposing the one or more substrates to a plasma-excited process gas, where the exposing causes erosion of a nitride material of the ceramic substrate holder. The processing can, for example, include depositing a thin film or a layer on the substrate, or etching a feature in the substrate or in a film or layer on the substrate. According to one embodiment of the invention, the process gas can contain a hydrogen-containing gas, an oxygen-containing gas, or a combination thereof. The hydrogen-containing gas can contain $H_2$, and the oxygen-containing gas can $O_2$, CO, $CO_2$, NO, $N_2O$, or $NO_2$, or a combination of two or more thereof. According to embodiments of the invention, in block 202, the ceramic substrate holder can be maintained at a temperature between about 100° C. and about 600° C. Furthermore, the gas pressure in the process chamber can be between about 0.1 mTorr and about 100 Torr, or between about 10 mTorr and about 1 Torr.

According to one embodiment of the invention, the processing in block 202 can include depositing a metal-containing film on the substrate by plasma-enhanced atomic layer deposition (PEALD). PEALD uses a film deposition sequence that includes exposing the substrate to temporally separated and alternating reactant pulses. When depositing a tantalum-containing film, a first reactant gas pulse can, for example, contain a tantalum precursor, and a second reactant gas pulse can, for example, contain plasma-excited $H_2$ gas. A wide variety of tantalum precursors may be utilized for depositing tantalum-containing films (e.g., tantalum metal, tantalum nitride, or tantalum carbonitride) by ALD. The tantalum precursors can contain tantalum and nitrogen but a separate nitrogen precursor (e.g., $NH_3$ or plasma-excited $N_2$) may be added as an additional source of nitrogen for depositing tantalum nitride or tantalum carbonitride films. Examples of tantalum precursors containing Ta—N intramolecular bonds include $Ta(NMe_2)_3(NCMe_2Et)$ (TAIMATA), $Ta(NEt_2)_5$ (PDEAT), $Ta(NMe_2)_5$ (PDMAT), $Ta(NEtMe)_5$ (PEMAT), $(tBuN)Ta(NMe_2)_3$ (TBTDMT), $(tBuN)Ta(NEt_2)_3$ (TBTDET), $(tBuN)Ta(NEtMe)_3$ (TBTEMT), and $(iPrN)Ta(NEt_2)_3$ (IPTDET).

In one example, a tantalum carbonitride film was deposited using temporally separated and alternating pulses of TAIMATA and plasma-excited $H_2$. The tantalum carbonitride film was deposited by performing the following sequence of gas pulses: 1 sec gas pulse of TAIMATA and Argon carrier gas, a 1 sec gas pulse of a first $H_2$ purge gas, a 10 sec gas pulse of plasma-excited $H_2$, and a 3 sec gas pulse of a second $H_2$ purge gas. The gas pressure in the process chamber was about 0.4 Torr, the substrate temperature was 180° C., the gas flow rate of the Argon carrier gas was 50 sccm, the gas flow rate of the first $H_2$ purge gas was 2000 sccm, the gas flow rate of the second $H_2$ purge gas was 50 sccm, and the gas flow rate of the $H_2$ gas during the plasma-excited $H_2$ exposure was 2000 sccm. The sequence of gas pulses was performed 34 times to deposit a tantalum nitride film with a thickness of 2 nm.

According to one embodiment of the invention, the processing in block 202 may be performed in the processing system 1 depicted in FIG. 1A, which is a single substrate processing system configured for processing only one substrate at a time. According to another embodiment of the invention, the processing in block 202 may be performed in a batch processing system configured for simultaneously processing a plurality of substrates (e.g., 25 or 50 substrates) in a heated ceramic tube. In this example, the substrates (wafers) may carried in a ceramic substrate holder (boat) that support the substrates in an array in which they are arranged in parallel rack-like structure. This ceramic substrate holder includes those in which a vertical stack of horizontally oriented substrates are spaced in a column. A common ceramic substrate holder may be formed of a set of parallel vertical rods having slots or notches evenly spaced along each of the rods. These notches are arranged in mutual alignment with the notches on the other rods to define a stack of shelves on which the substrates are robotically placed for processing. The spacing between the slots maintains the substrates at a sufficient distance from each other so that the substrates can be simultaneously exposed to a process.

Still referring to FIG. 2, the process flow 200 further includes, in block 204, refurbishing the ceramic substrate holder 20 in-situ without a substrate residing on the ceramic substrate holder, where the refurbishing includes exposing the ceramic substrate holder 20 to a plasma-excited nitrogen-containing gas in the process chamber 10 to at least partially reverse the erosion of the nitride material by incorporating nitrogen from the plasma-excited nitrogen-containing gas into the eroded nitride material. According to one embodiment of the invention, the nitrogen-containing gas can contain $N_2$, $N_2+H_2$, $NH_3$, $N_2H_4$, or a combination thereof. The refurbishing step in block 204 is usually performed following the processing of the one or more substrates in block 202 and after the last processed substrate has been removed from the process chamber 10. Thus, the refurbishing in block 204 can be performed without a substrate 25 residing on the ceramic substrate holder. This is referred to as waferless refurbishing. Alternatively, a substrate (e.g., a dummy substrate) may be present on the ceramic substrate holder during the refurbishing in block 204.

According to embodiments of the invention, in block 204, the ceramic substrate holder can be maintained at a temperature between about 100° C. and about 600° C., and a gas pressure in the process chamber can be between about 0.1 mTorr and about 100 Torr, or between about 10 mTorr and about 1 Torr. Referring back to FIG. 1A, in one example, the refurbishing in block 204 can include flowing a nitrogen-containing gas containing $N_2+H_2$ into the process chamber 10 using the second process material supply system 42 or the purge gas supply system 44, maintaining a gas pressure of about 1 Torr in the process chamber 10, and energizing the electrode 28 in the ceramic substrate holder 20 by applying RF power of about 500 W to the electrode 28 from the substrate power source 52 to form plasma-excited nitrogen-containing gas in the process chamber 10. A gas flow rate of $N_2$ can be between 1 and 1000 sccm, for example 500 sccm, a gas flow rate of $H_2$ can be between 1 sccm and 5000 sccm, for example 2000 sccm. In one example, a gas flow rate of 500 sccm $N_2$ and a gas flow rate of 2000 sccm $H_2$ may be utilized. In one example, pure $N_2$ may be used. The plasma exposure can, for example, be performed for a time period between about 30 sec and about 10 min, or between about 1 min and about 3 min.

Figure 3:
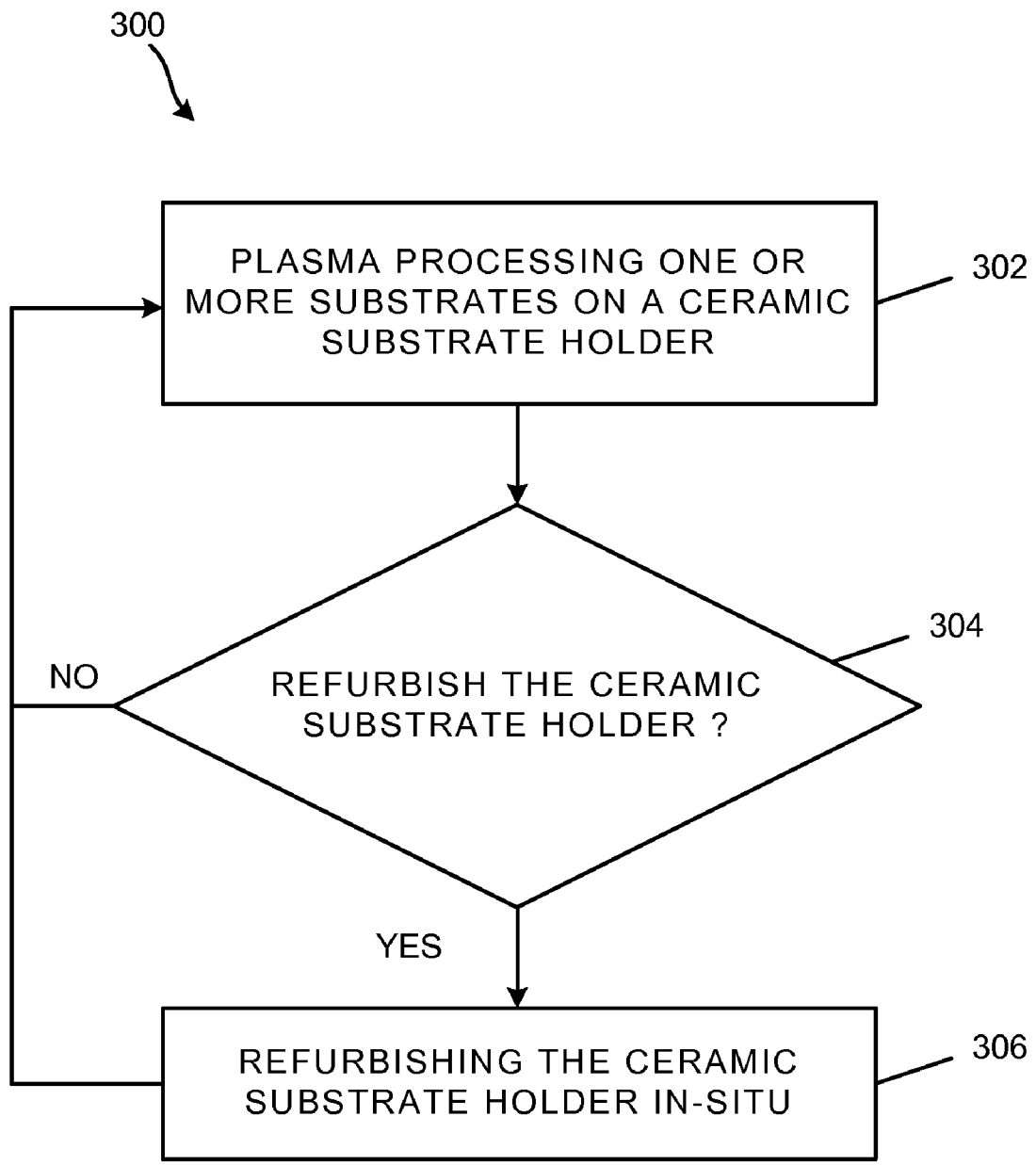
FIG. 3 is a flowchart of a method of in-situ refurbishing of an eroded ceramic substrate holder according to an embodiment of the invention.

FIG. 3 is a flowchart of a method of in-situ refurbishing of an eroded ceramic substrate holder according to an embodiment of the invention. The process flow 300 includes, in block 302, plasma processing one or more substrates on a ceramic substrate holder as described above in reference to block 202 of FIG. 2.

In block 304 of FIG. 3, a determination is made whether to process additional substrates or to refurbish of the ceramic substrate holder in-situ in block 306. Methods of refurbishing the ceramic substrate holder were described above in reference to block 204 of FIG. 2. According to one embodiment of the invention, the determination in block 304 can be based on visual inspection of the ceramic substrate holder. An example of visual erosion of the ceramic substrate holder was depicted in FIG. 1B as a shiny region 66 on a large portion of the lower surface 65 of the otherwise greyish matte finish of ceramic substrate holder 20. According to one embodiment of the invention, the determination in block 304 can be based on a measured value relating to an extent of the erosion of the ceramic substrate holder. In one example, the measured value can include measured electric power (e.g., $V_{pp}$ or $V_{dc}$) applied to the ceramic substrate holder. Referring back to FIG. 1A, the electric power can, for example, include power supplied by the substrate power source 52 or the substrate temperature control system 60. For example, the measured value can be monitored and then compared to a previously determined threshold value indicating that refurbishing is recommended or required, and performing the in-situ refurbishing when the measured value exceeds the threshold value.

According to one embodiment of the invention, a predetermined number of substrates may be processed or the processing system may be operated for a predetermined number of plasma hours before the refurbishing in block 306. For example, the predetermined number of substrates may be between 1 and 200 substrates, or between 2 and 100 substrates, but embodiments of the invention are not so limited and as more than 200 substrates may be processed before refurbishing is needed. For example, the predetermined number of plasma hours may between about 1 and about 1000, or between about 1 and about 10. Following refurbishing of the ceramic substrate holder in block 306, additional one or more substrates may be processed in block 302.

A plurality of embodiments for operating a processing system and refurbishing a ceramic substrate holder in-situ have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for operating a processing system, the method comprising:
    processing one or more substrates on a ceramic substrate holder in a process chamber of the processing system, the processing comprising exposing the one or more substrates to a plasma-excited process gas, the exposing causing erosion of a nitride material of the ceramic substrate holder; and
    refurbishing the ceramic substrate holder in-situ without a substrate residing on the ceramic substrate holder, the refurbishing comprising exposing the ceramic substrate holder to a plasma-excited nitrogen-containing gas in the process chamber to at least partially reverse the erosion of the nitride material.

2. The method of claim 1, wherein the process gas comprises a hydrogen-containing gas, an oxygen-containing gas, or a combination thereof.

3. The method of claim 1, wherein the process gas comprises $H_2$, $O_2$, CO, $CO_2$, NO, $N_2O$, or $NO_2$, or a combination of two or more thereof.

4. The method of claim 1, wherein the nitrogen-containing gas comprises $N_2$, $N_2+H_2$, $NH_3$, $N_2H_4$, or a combination thereof.

5. The method of claim 1, wherein the nitride material comprises aluminum nitride and the erosion preferentially removes nitrogen from the aluminum nitride.

6. The method of claim 1, wherein the plasma-excited process gas is generated by:
   flowing the process gas into the process chamber; and
   energizing an electrode in the ceramic substrate holder, energizing an electrode in a showerhead facing the substrate holder, or both.

7. The method of claim 1, wherein the plasma-excited nitrogen-containing gas is generated by:
   flowing the nitrogen-containing gas into the process chamber; and
   energizing an electrode in the ceramic substrate holder, energizing an electrode in a showerhead facing the substrate holder, or both.

8. The method of claim 1, further comprising:
   monitoring a measured value relating to an extent of the erosion;
   comparing the measured value to a threshold value; and
   performing the refurbishing when the measured value exceeds the threshold value.

9. The method of claim 8, wherein the measured value comprises measured electric power applied to the ceramic substrate holder.

10. A method for in-situ waferless refurbishing a ceramic substrate holder containing a nitride material and configured for supporting a substrate in a process chamber of a processing system, the method comprising:
    monitoring a measured value relating to an extent of erosion of the nitride material of the ceramic substrate holder;
    comparing the measured value to a threshold value; and
    performing the refurbishing when the measured value exceeds the threshold value, the refurbishing including exposing the ceramic substrate holder to a plasma-excited nitrogen-containing gas in the process chamber to at least partially reverse the erosion of the nitride material.

11. The method of claim 10, wherein the nitrogen-containing gas comprises $N_2$, $N_2+H_2$, $NH_3$, $N_2H_4$, or a combination thereof.

12. The method of claim 10, wherein the nitride material comprises aluminum nitride and the erosion preferentially removes nitrogen from the aluminum nitride.

13. The method of claim 10, wherein the plasma-excited process gas is generated by:
    flowing the process gas into the process chamber;
    energizing an electrode in the ceramic substrate holder, energizing an electrode in a showerhead facing the substrate holder, or both.

14. The method of claim 10, wherein the plasma-excited nitrogen-containing gas is generated by:
    flowing the nitrogen-containing gas into the process chamber;
    energizing an electrode in the ceramic substrate holder, energizing an electrode in a showerhead facing the substrate holder, or both.

15. The method of claim 10, further comprising:
    processing one or more substrates on the ceramic substrate holder in the process chamber, the processing comprising exposing the one or more substrates and the ceramic substrate holder to a plasma-excited process gas, the exposing causing the erosion of the nitride material.

16. The method of claim 15, wherein the process gas comprises a hydrogen-containing gas, an oxygen-containing gas, or a combination thereof.

17. The method of claim 15, wherein the process gas comprises $H_2$, $O_2$, CO, $CO_2$, NO, $N_2O$, or $NO_2$, or a combination of two or more thereof.

18. A method for operating a plasma-processing system, the method comprising:
    sequentially processing one or more substrates on a ceramic substrate holder in a process chamber of the plasma-processing system, the processing comprising alternately exposing a metal precursor and plasma-excited $H_2$ gas to the one or more substrates and the ceramic substrate holder, the exposing causing preferential nitrogen removal from a nitride material of the ceramic substrate holder; and
    refurbishing the ceramic substrate holder in-situ without a substrate residing on the ceramic substrate holder, the refurbishing comprising exposing the ceramic substrate holder to a plasma-excited nitrogen-containing gas in the process chamber to at least partially reverse the preferential nitrogen removal from the nitride material.

19. The method of claim 18, wherein the plasma-excited nitrogen-containing gas is generated by:
    flowing the nitrogen-containing gas into the process chamber; and
    energizing an electrode in the ceramic substrate holder.

* * * * *